United States Patent
Choi et al.

(10) Patent No.: US 7,605,068 B2
(45) Date of Patent: Oct. 20, 2009

(54) SEMICONDUCTOR DEVICE HAVING A SILICIDE LAYER AND MANUFACTURING METHOD THEREOF

(75) Inventors: Chel Jong Choi, Daejeon (KR); Yong Jin Kim, Daejeon (KR); Hi Deok Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/345,265

(22) Filed: Jan. 31, 2006

(65) Prior Publication Data
US 2007/0102706 A1    May 10, 2007

(30) Foreign Application Priority Data
Nov. 4, 2005    (KR)  .................... 10-2005-0105260

(51) Int. Cl.
H01L 21/3205    (2006.01)
H01L 21/44    (2006.01)
(52) U.S. Cl. .................. 438/592; 438/664; 438/682; 438/683
(58) Field of Classification Search ......... 438/580–583, 438/592, 663, 664, 682, 683; 257/410, 411, 257/616, E29.015, E29.132, E29.162, E21.165, 257/E21.199, E21.438
See application file for complete search history.

(56) References Cited

U.S. PATENT DOCUMENTS

| 5,840,626 | A | | 11/1998 | Ohguro | |
| 5,970,370 | A | * | 10/1999 | Besser et al. | ............... 438/586 |
| 6,121,139 | A | * | 9/2000 | Chang et al. | ............... 438/683 |
| 6,329,276 | B1 | | 12/2001 | Ku et al. | |
| 6,339,021 | B1 | | 1/2002 | Tan et al. | |
| 6,873,051 | B1 | | 3/2005 | Paton et al. | |
| 2004/0203229 | A1 | * | 10/2004 | Fang et al. | ............... 438/649 |

FOREIGN PATENT DOCUMENTS

JP    10-284732    10/1998
KR    1020040002003 A    1/2004

OTHER PUBLICATIONS

Yong-Jin Kim et al., "The Effect of Triple Capping Layer (Ti/Ni/TiN0 on the Electrical and Structural Properties of Nickel Monosilicide" Journal of the Electrochemical Society, 153 (1) G35-G38 (Nov. 10, 2005) 0013-4651/2005/153(1)/G35/4 The Electrochemical Society, Inc. (pp. G35-G38).

* cited by examiner

Primary Examiner—Hung Vu
(74) Attorney, Agent, or Firm—Blakely, Sokoloff, Taylor & Zafman LLP

(57) ABSTRACT

Provided is a semiconductor device and a manufacturing method thereof. The method includes the steps of: forming a thin film transistor including a substrate having a semiconductor layer and silicon, a gate insulation layer formed on the semiconductor layer, a gate electrode formed on the gate insulation layer, and source and drain regions formed in the semiconductor layer; forming a first metal layer on the substrate having the semiconductor layer and the gate electrode; forming a second metal layer on the first metal layer; forming a third metal layer on the second metal layer; forming a nitride layer on the third metal layer; and annealing the substrate having the nitride layer, and forming a silicide layer on the gate electrode and the source and drain regions.

13 Claims, 8 Drawing Sheets

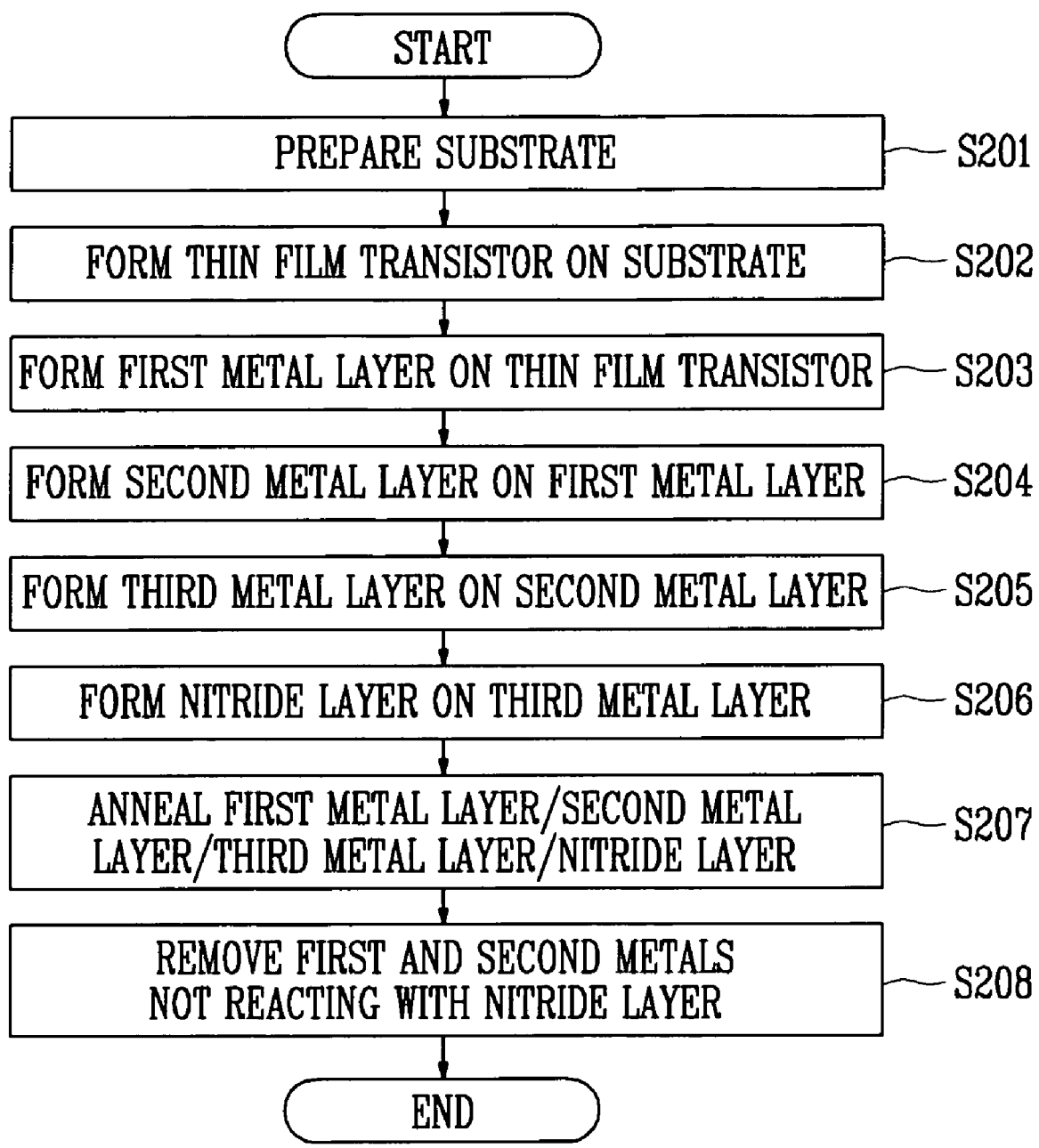

SEMICONDUCTOR DEVICE HAVING A SILICIDE LAYER AND MANUFACTURING METHOD THEREOF

CROSS-REFERENCE TO RELATED APPLICATION

This application claims priority to and the benefit of Korean Patent Application No. 10-2005-105260, filed Nov. 4, 2005, the disclosure of which is incorporated herein by reference in its entirety.

BACKGROUND

1. Field of the Invention

The present invention relates to a semiconductor device with a silicide layer and a manufacturing method thereof, and more particularly, to a semiconductor device with a silicide layer having excellent thermal stability, and a manufacturing method thereof.

2. Discussion of Related Art

In manufacturing a semiconductor device such as a thin film transistor, particularly, containing silicon, an electrical contact is made between a gate and a drain-source through a metal process. In recent years, as the integration of the semiconductor device increases, a contact region between the gate and the source-drain considerably becomes small (about 100 nm or less), thereby increasing contact and surface resistances and increasing resistor-capacitor (RC) delay. This reduces an operation speed of the silicon semiconductor device.

In order to solve such a problem, a method is widely used which forms a silicide layer (stable metal compound resulting from reaction of silicon and metal) in the contact region between the gate and the source-drain to reduce the surface resistance and the contact resistance. As the silicide layer, titanium silicide ($TiSi_2$) and cobalt silicide ($CoSi_2$) are most widely used to manufacture the stable silicon semiconductor device. The $TiSi_2$ and $CoSi_2$ have a low specific resistance suitable for all device operations.

However, according to "J. Electrochem. Soc. 144, P 2437" announced by D. K. Sohn et al. in 1997, in the case of the $TiSi_2$, as a line width narrows, it is difficult to phase transform from C-49 $TiSi_2$ having a high specific resistance to C-54 $TiSi_2$ having a low specific resistance, and a bridge phenomenon causing an electrical short circuit between the source-drain and the gate may appear. $CoSi_2$ has more merits than the $TiSi_2$, but has a drawback in that, according to "Mater. Sci. Eng. R. 16, p 43" announced by E. G. Colgan et al. in 1996 and "Materials Chemistry and Physis 52, P 99" announced by J. P. Gambino et al. in 1998, cobalt (Co) and silicon (Si) have very active reactivity, causing spark in cobalt silicide ($CoSi_x$) and, since Si much more than other silicides is needed to generate a predetermined amount of the $CoSi_2$, it is very difficult to form the $CoSi_2$ on a shallow junction at a low junction leakage current level.

In recent years, in order to overcome the above defects occurring from the $TiSi_2$ and the $CoSi_2$, nickel mono-silicide (NiSi) is contrived as a new silicide material having a good characteristic, and is used to manufacture a high-performance silicon semiconductor device. However, in the case where the NiSi is applied to the silicon semiconductor device, there is a drawback in that, as an annealing temperature increases, the sheet resistance abruptly increases, thereby deteriorating thermal stability and causing a leakage current. According to "Tech. Dig. Int. Electro Device Meet, p 453" announced by T. Ohguro et al, these drawbacks are known to result from oxidation of a NiSi thin layer caused by oxygen pollution. A method widely used to solve the drawback of the NiSi is to use a TiN capping layer.

In this method, as disclosed in Japan Patent Laid-Open Publication No. 1995-038104 and U.S Patent Laid-Open Publication No. 2004-97060, the TiN capping layer is deposited on a Ni layer as a diffusion prevention layer against oxygen, thereby forming a NiSi layer. However, in the case where the TiN capping layer is used, oxygen pollution can be effectively prevented, but there is a disadvantage in that, due to great interface roughness between the NiSi thin layer and the silicon substrate, thermal stability for subsequent annealing is deteriorated. As another method of preventing the oxygen pollution at the time of forming the NiSi thin layer, as disclosed in "IEEE Electron Device Letters Vol. 29, p 572" announced by Tuo-Hung Hou et al. in 1999, there is a method using a Ti layer as the diffusion prevention layer. This method has an advantage of providing high thermal stability together with prevention of the oxygen pollution but, has a drawback in that the oxygen pollution cannot be effectively prevented as much as the TiN capping layer and, in addition, since the Ti layer easily reacts with peripheral adjacent material due to its great reactivity, an exact and uniform process cannot be performed.

SUMMARY OF THE INVENTION

The present invention is directed to implementation of a semiconductor device with a metal silicide layer having an excellent characteristic and a manufacturing method thereof.

One aspect of the present invention is to provide a method of manufacturing a semiconductor device, the method including the steps of: forming a thin film transistor including a substrate having a semiconductor layer and silicon, a gate insulation layer formed on the semiconductor layer, a gate electrode formed on the gate insulation layer, and source and drain regions formed in the semiconductor layer; forming a first metal layer on the substrate having the semiconductor layer and the gate electrode; forming a second metal layer on the first metal layer; forming a third metal layer on the second metal layer; forming a nitride layer on the third metal layer; and annealing the substrate having the nitride layer, and forming a silicide layer on the gate electrode and the source and drain regions.

In the forming of the silicide layer, a mixture containing a first metal, a second metal, and silicon may be additionally formed on the silicide layer. The method may further include the step of, after the forming of the silicide layer, removing the first metal layer, the second metal layer, and the nitride layer not reacting. The silicon contained in the substrate may be one selected from the group consisting of single crystalline silicon, poly crystalline silicon, doped silicon, amorphous silicon, and a silicon compound. The first metal layer and the third metal layer may be formed of one selected from the group consisting of Ni, Ti, Co, Cu, Pt, W, Cr, Mo, and an alloy thereof. The first metal layer and the third metal layer may be formed of the same metal. The second metal layer may be formed of one selected from the group consisting of Ti, Co, Zr, Y, Ru, Pd, Cu, Au, Pt, Ag, Ir, Ta, Nb, V, Cr, Hf, Zr, Mo, and an alloy thereof. The second metal layer may be formed of a selected metal different from that of the first metal layer. The first metal layer may have a thickness of 1000 nm or less. The second metal layer may have 0.9 times or less of a thickness of the first metal layer.

Another aspect of the present invention is to provide a semiconductor device including: a thin film transistor including a substrate having a semiconductor layer and silicon, a gate insulation layer formed on the semiconductor layer, a gate electrode formed on the gate insulation layer, and source and drain regions formed in the semiconductor layer; a metal silicide layer containing at least two kinds of metals and formed on the gate electrode and the source and drain regions; and a compound formed on the metal silicide layer, and having the two metals and the silicon mixed.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 2 is a schematic block diagram illustrating a method of manufacturing a semiconductor device according to an embodiment of the present invention;

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1A:
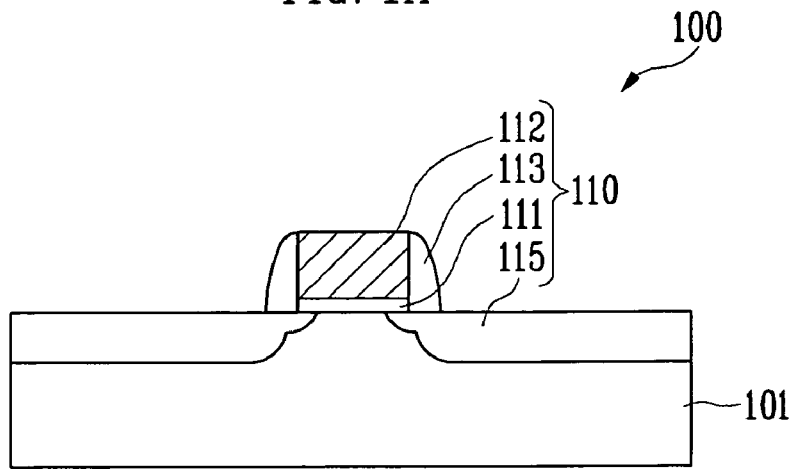
FIGS. 1A to 1C are side sectional views illustrating a method of manufacturing a semiconductor device according to an embodiment of the present invention.
Figure 1B:
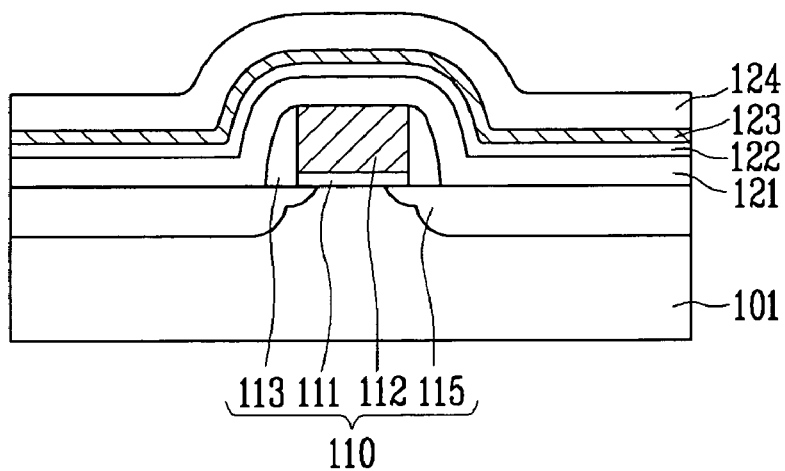
Figure 1C:
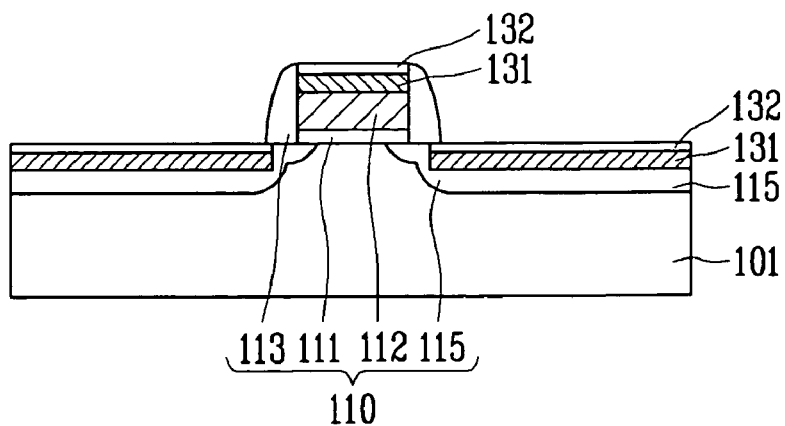

FIGS. 1A to 1C are side sectional views illustrating a method of manufacturing a semiconductor device according to an embodiment of the present invention, and FIG. 2 is a schematic block diagram illustrating the method of manufacturing the semiconductor device according to an embodiment of the present invention.

Referring to FIGS. 1A and 2, in order to manufacture the semiconductor device 100, a substrate 101 containing silicon is prepared (Step 201). It is desirable that the substrate 101 generally contains single crystalline silicon, but can contain not only poly crystalline silicon and amorphous silicon, but also all materials containing silicon such as $Si_xGe_{1-x}$ (0<x<1), $Si_xN_{1-x}$ (0<x <1), and silicon carbide (SiC). In this embodiment, a single substrate containing silicon is provided, but the substrate and a semiconductor layer can be provided as separate layers.

Next, a thin film transistor 110 having a gate insulation layer 111, a gate electrode 112, a sidewall spacer 113, and a source-drain region with a lightly doped drain is formed on the substrate 101 (Step 202). After the forming of the thin film transistor 110, a natural oxide layer is removed from a surface of the substrate on which the thin film transistor 110 is formed.

Referring to FIGS. 1B and 2, a first metal layer 121 is formed on the thin film transistor 110 (Step 203), a second metal layer 122 is formed on the first metal layer 121 (Step 204), a third metal layer 123 is formed on the second metal layer 122 (Step 205), and a nitride layer 124 is formed on the third metal layer 123 (Step 206). The first to third metal layers 121, 122, and 123, and the nitride layer 124 can be deposited using a deposition method such as a sputtering method, a chemical vapor deposition method, a physical vapor deposition method, a metal organic chemical vapor deposition method, and a molecular beam epitaxy method. In addition to the above deposition method, various deposition methods can be employed. In this embodiment, since the first metal layer 121 and the third metal layer 123 are deposited of the same metal, they are described as the same metal.

In detail, the first and third metal layers 121 and 123 can be deposited of at least one selected from the group consisting of nickel (Ni), titanium (Ti), cobalt (Co), copper (Cu), platinum (Pt), tungsten (W), chrome (Cr), molybdenum (Mo), and an alloy thereof. The first and third metal layers 121 and 123 are deposited to a predetermined thickness and, preferably, to a thickness of less than 1000 nm. This is because, when the first and third metal layers 121 and 123 have a thickness of exceeding 1000 nm, a metal silicide layer is excessively formed after annealing, thereby causing junction penetration at a junction region.

The second metal layer 122 may be preferably a metal capable of reacting with the first metal layer 121. The second metal layer 122 can be deposited of one selected from the group consisting of titanium (Ti), cobalt (Co), zirconium (Zr), yttrium (Y), rubidium (Ru), palladium (Pd), copper (Cu), aurum (Au), platinum (Pt), augentum (Ag), iridium (Ir), tantalum (Ta), niobium (Nb), vanadium (V), chrome (Cr), hafnium (Hf), molybdenum (Mo), and an alloy thereof, using one of the various deposition methods. The second metal layer 122 is deposited of a selected metal different from the first metal layer 121. The second metal layer 122 preferably has 0.9 times the thickness of the first metal layer 121. For example, when the first metal layer 121 has a thickness of 800 nm, the second metal layer 122 preferably has a thickness of 720 nm or less. If the second metal layer 122 has 0.9 times or more the thickness of the first metal layer 121, metal of the second metal layer 122 is contained in great amount in the first metal layer 121, thereby degrading an initial characteristic of a first metal silicide (layer).

The nitride layer 124 formed on the third metal layer 123 is formed by combining nitrogen with the substrate 101 containing silicon, a first metal forming the first and third metal layers 121 and 123, a second metal forming the second metal layer 122, and an alloy thereof. Since the nitride layer 124 has a property of a diffusion prevention layer for preventing diffusion of water or sodium, it can be used as a final protective layer of the silicon semiconductor device. Further, instead of the nitride layer 124, a fireproof metal including tungsten (W), chrome (Cr), molybdenum (Mo), and an alloy thereof can be deposited on the third metal layer 123.

Next, referring to FIGS. 1C and 2, the first metal layer 121/second metal layer 122/third metal layer 123/nitride layer 124 subsequently formed on the thin film transistor 110 are annealed (Step 207), thereby forming a first metal silicide layer 131 and a metal compound 132 being a mixture of the first metal, the second metal, and silicon. In a process of annealing the laminated metal layers 121, 122, and 123 and nitride layer 124, heat is supplied to the metal layers to react the substrate 101 containing silicon, or the first metals 121 and 123 and the second metal 122, and rapid thermal annealing (RTA), furnace annealing, laser annealing, or the like can be used. A necessary annealing temperature is in a range of about 200° C. to 1000° C., but the range of the annealing temperature can be selected considering a kind and a characteristic of a metal silicide to be formed. For example, it is desirable that, when nickel silicide (NiSi) is formed, it is annealed in a range of about 300° C. to 800° C. This is because, when the annealing is performed at 300° C. or less, nickel silicide ($Ni_2Si$) can be formed, and when being performed at 800° C. or more, nickel silicide ($NiSi_2$) can be formed.

After the completion of the annealing (Step 207), the first metal and the second metal not reacting with the nitride layer 124 are removed (Step 208), thereby forming the first metal silicide layer 131 containing the second metal thermally stable. Through the above process, the silicon semiconductor device 100 including the thermally stable silicide layer is formed. In FIG. 2, an additional annealing process after the Step 208 (step of removing the metal not reacting) is not performed. However, for stability of the first metal silicide layer 131, an additional annealing process can be also performed during a little longer time than in the annealing process of the Step 207. While, in this embodiment, only the description in relation to the process of manufacturing the thin film transistor 110 for convenience of illustration has been given, a capacitor and a light emitting device electrically connected with the thin film transistor 110 may be manufactured, in addition to the thin film transistor 110.

Hereinafter, the above construction will be in detail described with reference to an embodiment of the present invention.

Figure 3:
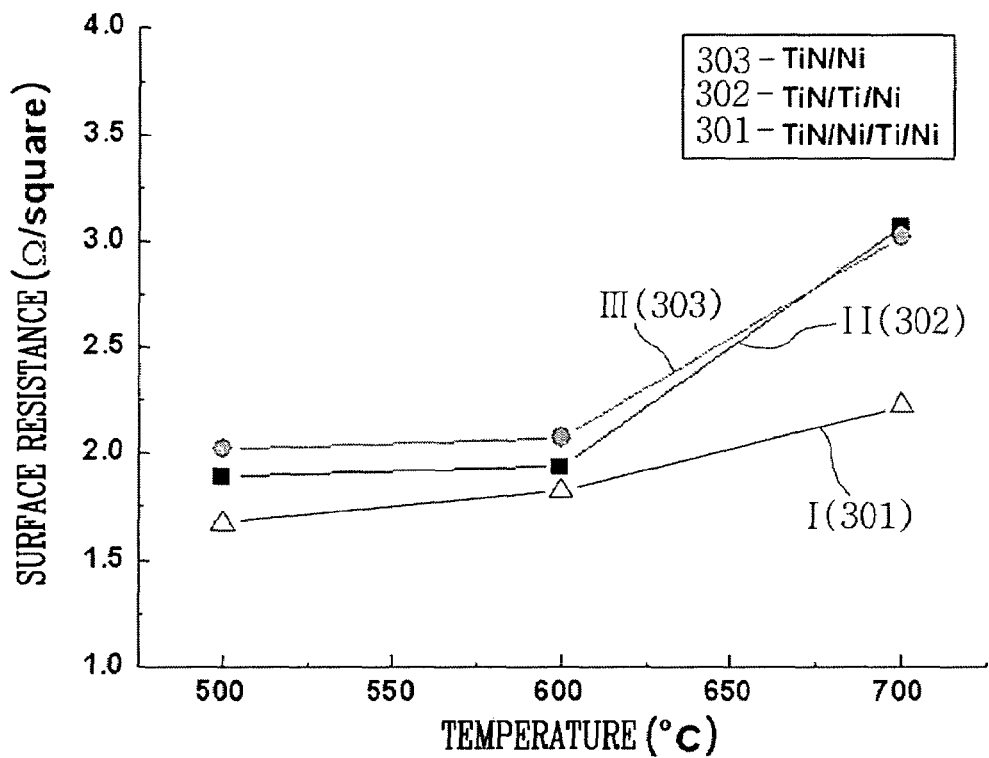
FIG. 3 is a graph illustrating a variation of a surface resistance value depending on annealing of a sample (TiN/Ni/Ti/Ni/silicon substrate) and other samples (TiN/Ti/Ni and TiN/Ni/silicon substrates) manufactured according to an embodiment of the present invention.

FIG. 3 is a graph illustrating a variation of a surface resistance value depending on the annealing of the sample (TiN/Ni/Ti/Ni/silicon substrate) and the other samples (TiN/Ti/Ni and TiN/Ni/silicon substrates) manufactured according to an embodiment of the present invention.

For an experiment, the sample (TiN/Ni/Ti/Ni/silicon substrate) is first prepared. Referring to FIGS. 1A to 1C and FIG. 2, in order to prepare the sample, the thin film transistor 110 is formed on the substrate 101 containing silicon and then, the natural oxide layer is removed from the resultant surface. The first metal layer 121 is then deposited of nickel (Ni) to a thickness of about 30 nm using a deposition device, and the second metal layer 122 is deposited of titanium (Ti) to a thickness of about 1 nm, and the third metal layer 123 is deposited of nickel (Ni) to a thickness of about 1 nm, similarly with the first metal layer 121. The nitride layer 124 is deposited of titanium nitride (TiN) on the third metal layer 123 to a thickness of about 15 nm, thereby forming the TiN(15 nm)/Ni(1 nm)/Ti(1 nm)/Ni(30 nm)/silicon substrate 301.

Next, in order to form the metal silicide layer, the annealing is performed in an atmosphere of nitrogen during a predetermined time (about 30 seconds) at a predetermined range of temperature (about 500° C. to 700° C.) and then, nickel (nickel) and titanium (Ti) not reacting with titanium nitride (TiN) are removed using an etching process. In this embodiment, wet etching is performed using a solvent obtained by mixing sulfuric acid and hydrogen peroxide on a 3 to 1 ratio.

In order to compare the above construction of the present invention with a different construction of a conventional art, comparative samples (TiN(15 nm)/Ti(1 nm)/Ni(30 nm)/silicon substrate 302 and TiN(15 nm)/Ni(30 nm)/silicon substrate 303) are manufactured, and the same annealing and etching processes are performed in the same method as the embodiment of the present invention.

Referring to FIG. 3, a horizontal axis represents temperature for annealing the three samples 301, 302, and 303, and a vertical axis represents the surface resistance. The surface resistance value of the nickel silicide (NiSi) layer formed by annealing and etching the three samples 301, 302, and 303 will be described. When the sample 301 is annealed at 500 C., the sample 301 (linear graph I) has a surface resistance of about 1.7, the sample 302 (linear graph II) has a surface resistance of about 1.8, and the sample 303 (linear graph III) has a surface resistance of about 2.0. However, when the three samples 301, 302, and 303 are annealed at 700° C., the sample 301 (linear graph I) has a surface resistance of about 2, the sample 302 (linear graph II) has a surface resistance of about 3, and the sample 303 (linear graph III) has a surface resistance of about 30. Accordingly, the sample 301 has not only a lower surface resistance value than the samples 302 and 303 over a whole range of temperature of 500° C. to 700° C. but also has a gentle variation of the surface resistance. It shows that the sample 301 is thermally stable.

Figure 4A:
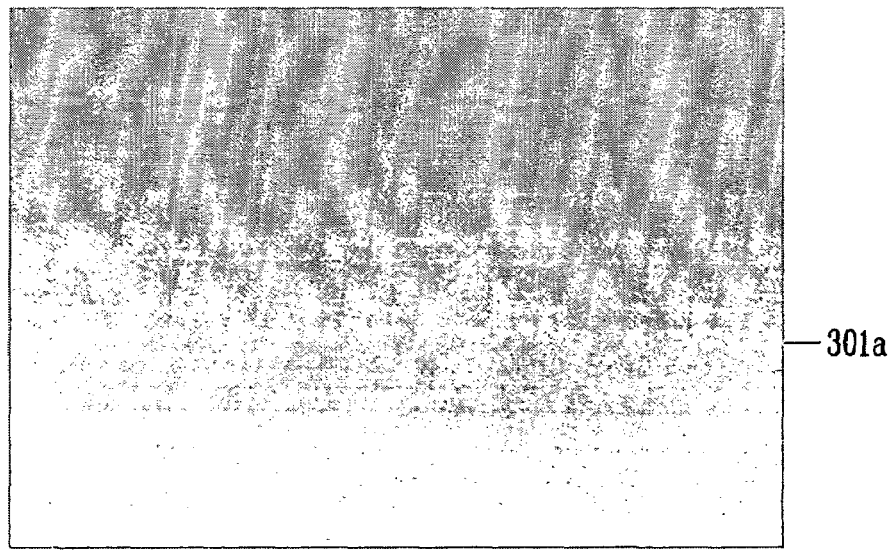
FIGS. 4A to 4C are photographs taken from surfaces of silicide layers formed using the three samples of FIG. 3.
Figure 4B:
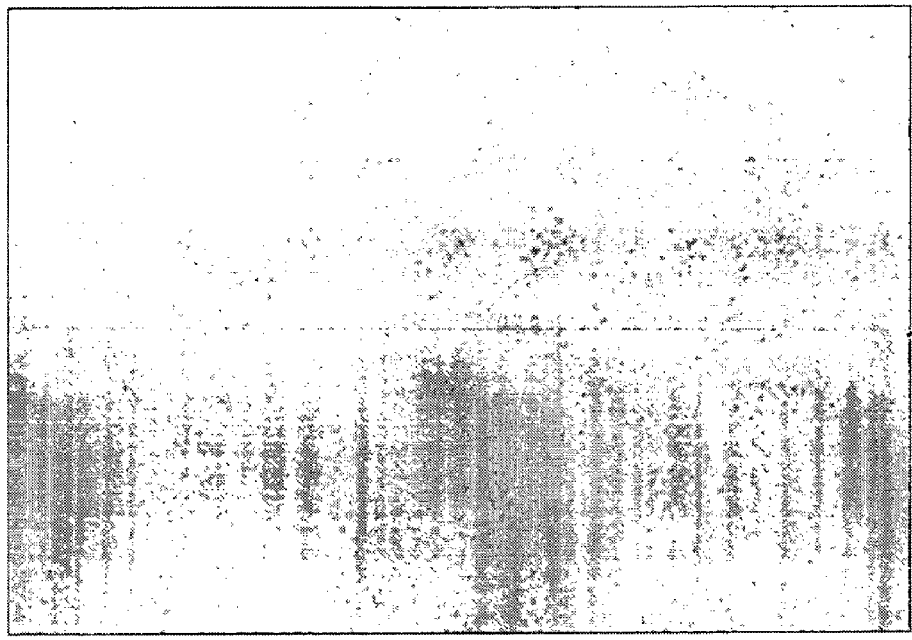
Figure 4C:
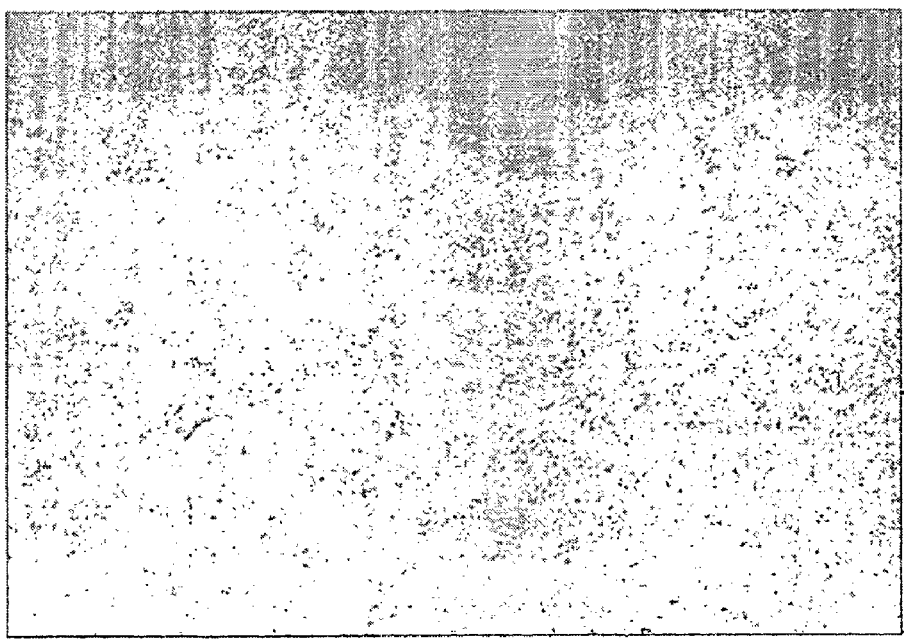

FIGS. 4A to 4C are photographs taken from surfaces of the silicide layers formed using the three samples of FIG. 3.

In FIGS. 4A to 4C, the photographs are taken, using a scanning electron microscopy (SEM), from the surfaces of the silicides which are obtained by annealing the three samples 301, 302, and 303 using the RTA for thirty seconds at 500° C. and then, removing the metals not reacting with the nitride layer 124.

Referring to FIG. 4A, a silicide surface 301a obtained by annealing the sample 301 (TiN(15 nm)/Ni(1 nm)/Ti(1 nm)/Ni(30 nm)/silicon substrate) is wholly flat and does not have a defect. On the contrary, referring to FIGS. 4B to 4C, in the sample 302 (TiN(15 nm)/Ti(1 nm)/Ni(30 nm)silicon substrate) and the sample 303 (TiN(15 nm)/Ni(30 nm)/silicon substrate), silicide surfaces 302a and 303a are not only rugged but also cohesion occurs on the surfaces, thereby uncovering with the silicide and exposing an underlying silicon region (black spot). Accordingly, the surface of the silicide 301a formed using the sample 301 is more stable than those of the silicides 302a and 302a formed using the samples 302 and 303.

Figure 5A:
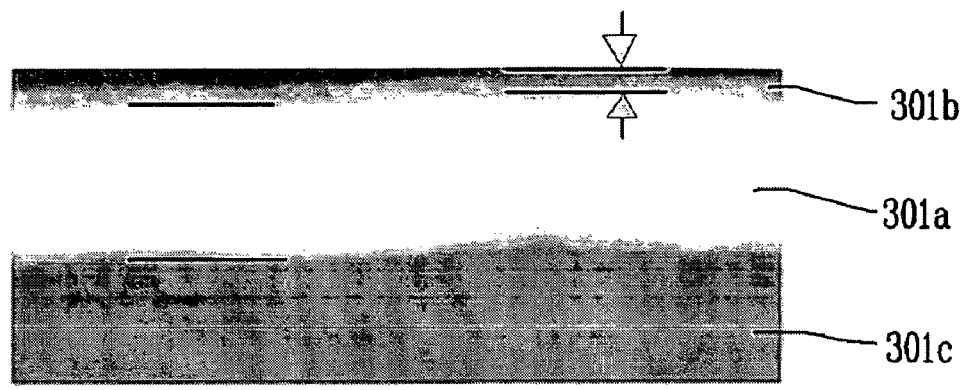
FIGS. 5A to 5C are photographs taken from sections of silicide layers obtained using the three samples of FIG. 3.
Figure 5B:
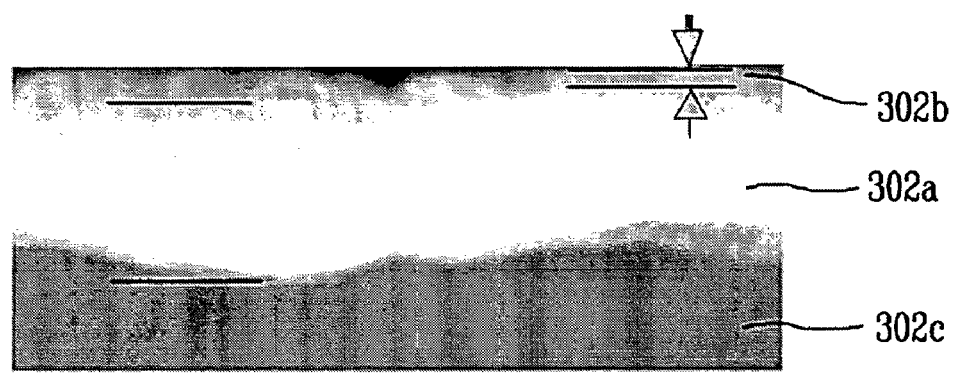
Figure 5C:
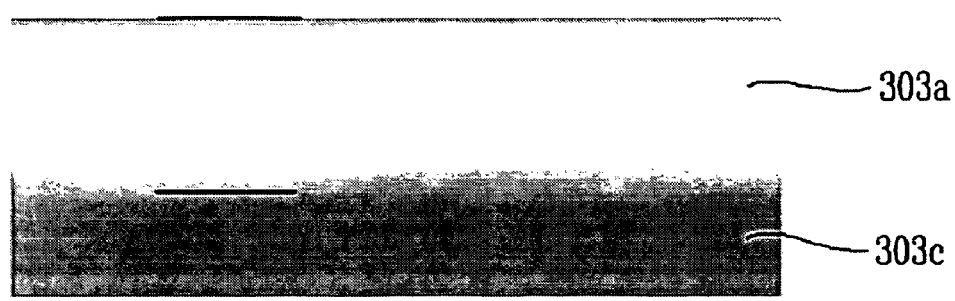

FIGS. 5A to 5C are photographs taken from sections of the silicide layers obtained using the three samples of FIG. 3. In FIGS. 5A to 5C, the photographs are taken, using a scanning transmission electron microscopy (STEM), from the sections of the silicide layer obtained by annealing the three samples 301, 302, and 303 using the RTA for thirty seconds at 500° C. and then, removing the metals not reacting with the nitride layer 124.

Referring to FIGS. 5A and 5B, in the sample 301 (TiN(15 nm)/Ni(1 nm)/Ti(1 nm)/Ni(30 nm)/silicon substrate) and the sample 302 (TiN(15 nm)/Ti(1 nm)/Ni(30 nm)/silicon substrate), the compound layers 301b and 302b are formed to a predetermined thickness on the surfaces of the silicide layers 301a and 302a. The compound layers 301b and 302b are mixtures obtained after annealed, and can be confirmed to be triple compounds of Ni—Ti—Si through analysis using an Energy Dispersive X-ray spectroscopy (EDX). Further, an interface between the silicide 301a formed using the sample 301 and the silicon substrate 301c is relatively flat, but an interface between the silicide 302a formed using the sample 302 and the silicon substrate 302c is not flat in comparison with the sample 301. Accordingly, in the case where the silicide 301a is formed using the sample 301, the more stable silicide 301a is formed. On the contrary, in the sample 303 (TiN(15 nm)/Ni(30 nm)/silicon substrate), the compound is not formed on the surface of the silicide 303a. Therefore, the sample 303 is different in structure itself from the samples 301 and 302.

Consequently, referring to FIG. 3, FIGS. 4A to 4C, and FIGS. 5A to 5C, the silicide 301a formed using the sample 301 has more excellent surface and interface characteristics and therefore has a lower surface resistance, compared to the silicides 302a and 303a formed using the other samples 302 and 303. A relationship between the surface resistance of the silicide, and the roughness of the silicide surface and the interface between the silicide and the silicon substrate has been already disclosed in "Jpn. J. Appl. Phys. Vol.41, p1969" announced by C. J. Choi in 2002.

Figure 6:
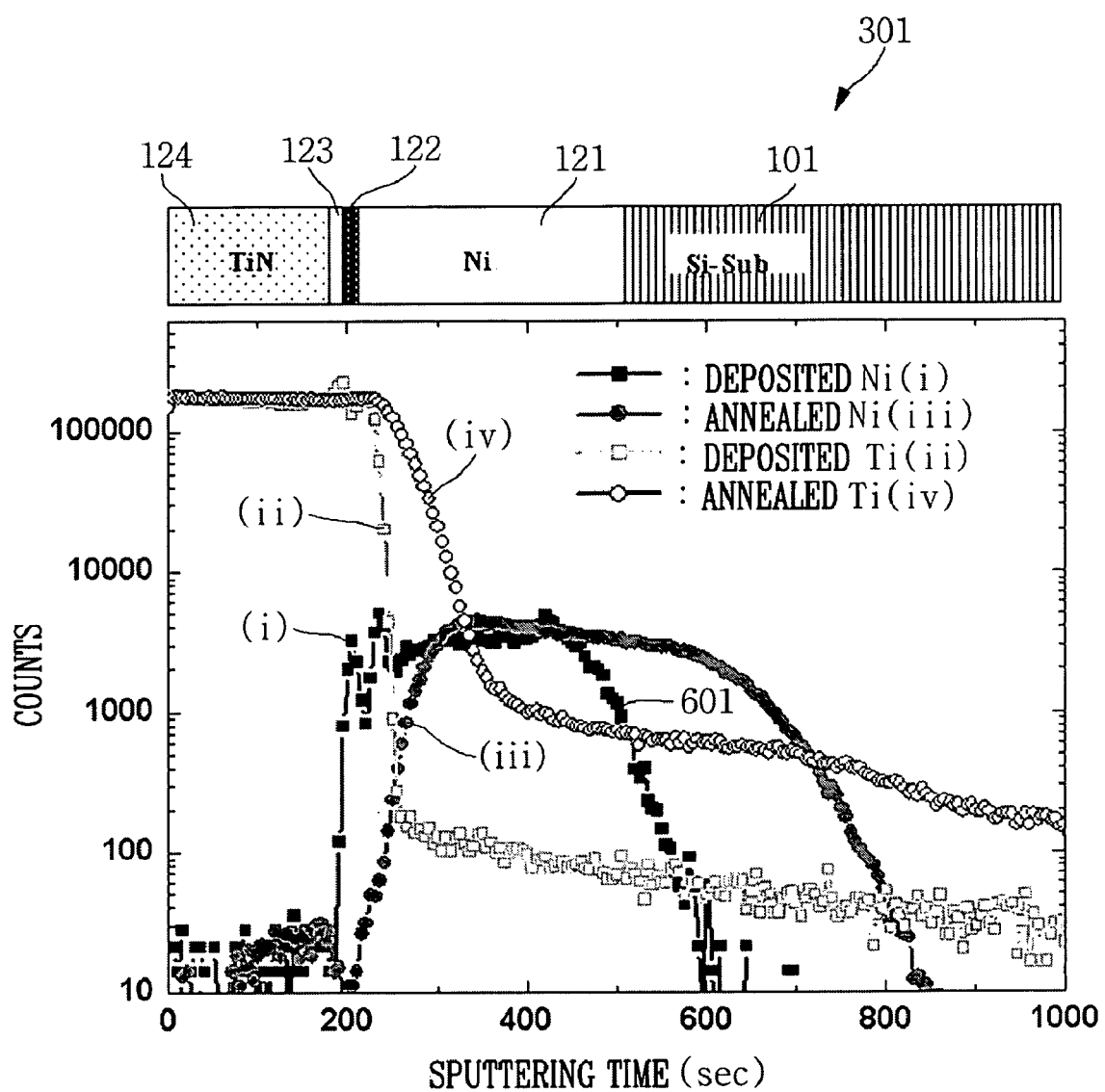
FIG. 6 is a graph illustrating a distribution of Ni and Ti when a sample is not annealed, and a distribution of Ni and Ti when being annealed according to an embodiment of the present invention.

FIG. 6 is a graph illustrating a distribution of Ni and Ti when the sample is not annealed, and a distribution of Ni and Ti when the sample is annealed according to an embodiment of the present invention. Referring to FIG. 6, a horizontal axis represents a sputtering time (time taken to cut out the laminated sample in order to confirm diffusion of a constitutional component constituting the sample), and a vertical axis represents counts. FIG. 6 shows graphs (i and ii) for Ni and Ti deposited before annealing, and graphs (iii and iv) for Ni and Ti obtained after the annealing.

In comparison of the Ni graph (iii) after the annealing with the Ni graph (i) before the annealing, Ni after the annealing is more diffused in a direction of the silicon substrate 101. This means that Ni reacts to Si in the annealing process, thereby forming the nickel silicide (NiSi). Comparing between the Ti graphs (ii and iv) before and after the annealing, it can be appreciated that, after the annealing, a large amount of Ti exists within the NiSi thin layer. In other words, considering a diffusion path of Ti, it can be appreciated that Ti exists along around a boundary of NiSi where Ti diffusion is relatively facilitated.

In this embodiment, the sample 301 has a more excellent structural characteristic (uniform surface and interface) compared to the other comparative samples 302 and 303 due to a reaction flow of Ti. Since Ti has considerably strong reaction with Ni or Si, when Ti reaction occurs only in one direction like the sample 302, the surface and the interface of the triple compound of Ni—Ti—Ni formed as in FIG. 5B become rough. Therefore, the interface roughness between the silicide 301a and the silicon substrate 301c increases as well. However, referring to FIG. 5A, in the sample 301, the Ni layer deposited on the Ti layer disperses the Ti reaction flow in both up and down directions. Therefore, the silicide 301a having the excellent interface characteristic is formed together with the uniform Ni—Ti—Si compound 30 lb.

Figure 7:
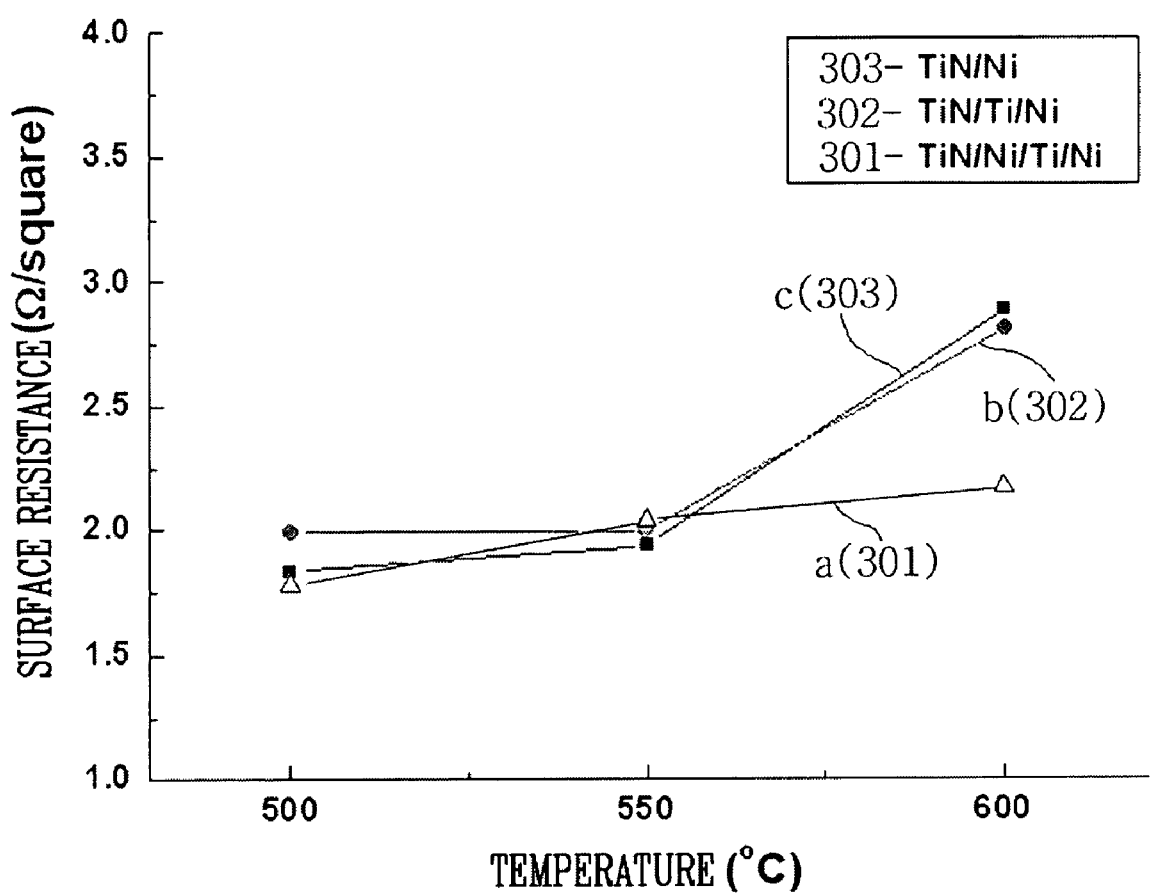
FIG. 7 is a graph illustrating a variation of a surface resistance value when subsequent annealing is performed on samples having silicide layers formed using the sample (TiN/Ni/Ti/Ni/silicon substrate) and the other samples (TiN/Ti/Ni and TiN/Ni/silicon substrates) manufactured according to an embodiment of the present invention.

FIG. 7 is a graph illustrating the variation of the surface resistance value when subsequent annealing is performed on the samples 301, 302, and 303 having the silicide layers according to an embodiment of the present invention.

Referring to FIG. 7, a horizontal axis represents a subsequent annealing temperature, and a vertical axis represents a surface resistance value.

Referring to graphs (b:302 and c:303) of FIG. 7, as the subsequent annealing is performed on the samples 302 and 303 and the temperature gradually increases, the surface resistance abruptly increases. On the contrary, even though the subsequent annealing is performed on the sample 301 and the temperature gradually increases, the surface resistance value is relatively stably maintained to be constant (graph "a"). It can be again confirmed from the result that the silicide layer formed using the TiN(15 nm)/Ni(1 nm)/Ti(1 nm)/Ni(30 nm)/silicon substrate is very thermally stable.

The inventive silicide layer has an excellent thermal stability since the silicide layer containing a predetermined amount of Ti is formed as shown in FIG. 6. In general, a phenomenon of thermal degradation of the silicide occurs because a phenomenon of cohesion, caused by boundary movement, of the silicide is progressed. If Ti exists around the boundary of the silicide, the boundary movement phenomenon is effectively prevented, thereby increasing the thermal stability. This is disclosed in "J. Eelectrochem. Soc. 144, p2437" by D. K. Sohn et al. in 1997. Accordingly, it can be appreciated from FIG. 6 that Ti exists in large amount around the silicide formed using the sample 301, in particular, around the silicide boundary, and Ti can effectively prevent the boundary movement phenomenon, thereby improving the thermal stability.

Figure 8A:
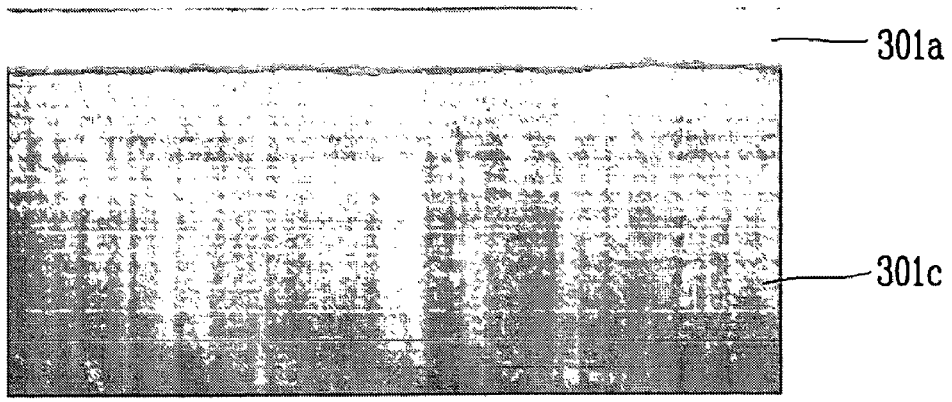
FIGS. 8A to 8C are photographs taken from sections of the three samples having the silicide layer of FIG. 7.
Figure 8B:
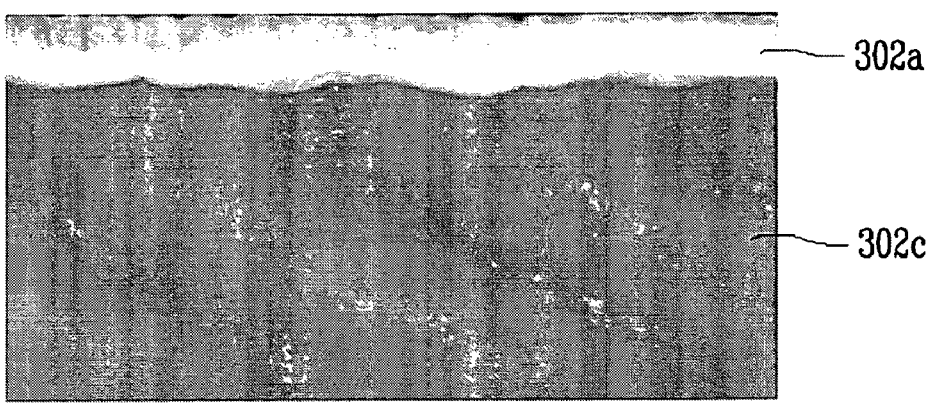
Figure 8C:
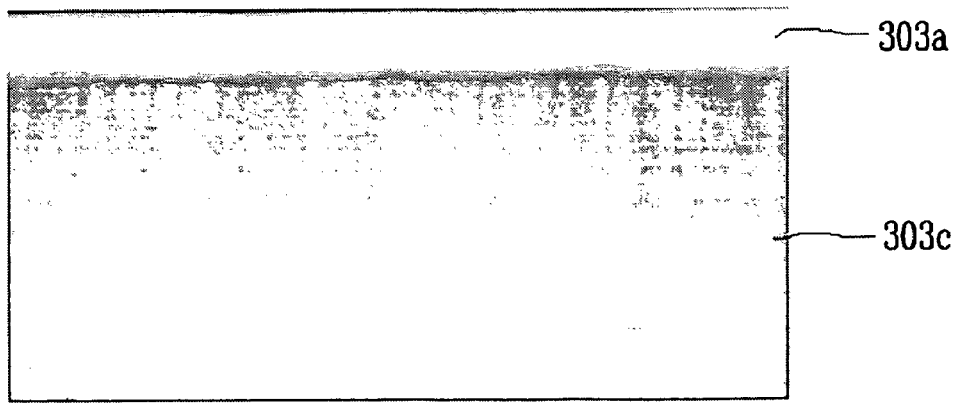

FIGS. 8A to 8C are photographs taken from sections of the three samples subsequently annealed and having the silicide layer of FIG. 7.

Referring to the photograph of FIG. 8A, after the TiN(15 nm)/Ni(1 nm)/Ti(1 nm)/Ni(30 nm)/silicon substrate 301 is twice annealed, the interface roughness between the formed silicide 301a and the silicon substrate 301c can be confirmed. In FIGS. 8B and 8C, the interface roughness between the silicides 302a and 303a and the silicon substrates 302c and 303c can be confirmed in the sample 302 (TiN(15 nm) /Ti(1 nm)/Ni(30 nm)/silicon substrate) and the sample 303 (TiN(15 nm) /Ni(30 nm)/silicon substrate). From the confirmation through the photographs, it can be appreciated that the interface roughness between the silicide 301a and the silicon substrate 301c of the sample 301 is relatively less and has a smooth surface in comparison with the samples 302 and 303.

As described above, the present invention can provide the silicide layer in which the surface of the first metal silicide layer formed on the silicon substrate and the interface between the silicide layer and the silicon substrate are uniform, by annealing the laminated structure of the first metal layer/second metal layer/third metal layer/nitride layer. Since the surface and the interface of the silicide layer are uniform, the semiconductor device of a high performance and a high quality can be manufactured to have the low surface resistance and the thermal stability.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a semiconductor device, the method comprising:
   forming a thin film transistor comprising a substrate having a semiconductor layer and silicon, a gate insulation layer formed on the semiconductor layer, a gate electrode formed on the gate insulation layer, and source and drain regions formed in the semiconductor layer;
   forming a first metal layer on the substrate having the semiconductor layer and the gate electrode;
   forming a second metal layer on the first metal layer, the second metal layer is formed of a metal different from that of the first metal layer, the second metal layer formed thinner than the first metal layer;
   forming a third metal layer on the second metal layer;
   forming a nitride layer on the third metal layer; and annealing the substrate having the nitride layer, and forming a silicide layer on the gate electrode and the source and drain regions.

2. The method according to claim 1, wherein the forming the silicide layer comprises forming a mixture including a first metal, a second metal, and silicon.

3. The method according to claim 2, further comprising, after the forming the silicide layer, removing the first metal layer, the second metal layer, and the nitride layer that do not react.

4. The method according to claim 2, wherein the silicon contained in the substrate is one selected from the group consisting of a single crystalline silicon, a poly crystalline silicon, a doped silicon, an amorphous silicon, and a silicon compound.

5. The method according to claim 2, wherein the first metal layer and the third metal layer are formed of one selected from the group consisting of Ni, Ti, Co, Cu, Pt, W, Cr, Mo, and an alloy thereof.

6. The method according to claim 5, wherein the first metal layer and the third metal layer are formed of the same metal.

7. The method according to claim 2, wherein the second metal layer is formed of one selected from the group consisting of Ti, Co, Zr, Y, Ru, Pd, Cu, Au, Pt, Ag, Ir, Ta, Nb, V, Cr, Hf, Zr, Mo, and an alloy thereof.

8. The method according to claim 2, wherein the first metal layer has a thickness of 1000 nm or less.

9. The method according to claim 2, wherein the second metal layer has 0.9 times or less a thickness of the first metal layer.

10. The method according to claim 1, further comprising, after the forming the silicide layer, removing the first metal layer, the second metal layer, and the nitride layer that do not react.

11. The method of claim 1, wherein forming the first metal layer comprises forming a layer that comprises nickel.

12. The method of claim 11, wherein forming the second metal layer comprises forming a layer that comprises titanium.

13. The method of claim 1, wherein forming the silicide layer comprises forming a metal of the second metal layer in large amount around a boundary of a silicide formed from the silicon and a metal of the first metal layer.

* * * * *